(12) United States Patent
Yuan et al.

(10) Patent No.: US 9,122,830 B2
(45) Date of Patent: Sep. 1, 2015

(54) WIDE PIN FOR IMPROVED CIRCUIT ROUTING

(71) Applicant: GLOBALFOUNDRIES Inc., Grand Cayman (KY)

(72) Inventors: Lei Yuan, Cupertino, CA (US); Juhan Kim, Santa Clara, CA (US); Jongwook Kye, Pleasanton, CA (US); Mahbub Rashed, Cupertino, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/908,096

(22) Filed: Jun. 3, 2013

(65) Prior Publication Data

US 2014/0353842 A1    Dec. 4, 2014

(51) Int. Cl.
| | | |
|---|---|---|
| *H01L 27/02* | (2006.01) | |
| *G06F 17/50* | (2006.01) | |
| *H01L 27/118* | (2006.01) | |
| *H01L 23/522* | (2006.01) | |

(52) U.S. Cl.
CPC ........ *G06F 17/5077* (2013.01); *H01L 27/0207* (2013.01); *H01L 27/11807* (2013.01); *H01L 23/5226* (2013.01)

(58) Field of Classification Search
CPC .............. H01L 23/528; H01L 23/5283; H01L 27/0203; H01L 27/0207
USPC .................................. 257/E21.575; 438/618
See application file for complete search history.

(56) References Cited

U.S. PATENT DOCUMENTS

| 7,406,671 | B2 | 7/2008 | Corbeil, Jr. et al. | |
|---|---|---|---|---|
| 7,932,545 | B2 | 4/2011 | Becker et al. | |
| 8,247,846 | B2 * | 8/2012 | Becker | 257/211 |
| 2007/0001304 | A1 * | 1/2007 | Liaw | 257/758 |
| 2012/0163105 | A1 * | 6/2012 | Otsuka | 365/200 |
| 2012/0223368 | A1 * | 9/2012 | Sherlekar et al. | 257/203 |

OTHER PUBLICATIONS

Ghaida et al., "A Methodology for the Early Exploration of Design Rules for Multiple-Patterning Technologies", IEEE/ACM International Conference on Computer-Aided Design (ICCAD), Nov. 5-8, 2012, San Jose, California, USA, Copyright 2012, 7 pages.

* cited by examiner

*Primary Examiner* — Roy Potter
*Assistant Examiner* — Paul Patton
(74) *Attorney, Agent, or Firm* — Williams Morgan, P.C.

(57) ABSTRACT

Embodiments described herein provide approaches for improved circuit routing using a wide-edge pin. Specifically, provided is an integrated circuit (IC) device comprising a standard cell having a first metal layer (M1) pin coupled to a second metal layer (M2) wire at a via. The M1 pin has a width greater than a width of the via sufficient to satisfy an enclosure rule for the via, while the M1 pin extends vertically past the via a distance substantially equal to or greater than zero. This layout increases the number of available pin access points within the standard cell and thus improves routing efficiency and chip size.

20 Claims, 6 Drawing Sheets

US 9,122,830 B2

WIDE PIN FOR IMPROVED CIRCUIT ROUTING

BACKGROUND

1. Technical Field

This invention relates generally to integrated circuit (IC) cell design, and more particularly, to manufacturing approaches for enhanced circuit routing.

2. Related Art

Computer-aided cell-based design has been developed for designing large scale ICs such as application specific integrated circuits (ASICs) and gate arrays. The cell is a circuit that has been pre-designed and pre-verified as a building block. Design technologies known as standard cell and gate array use different types of such building blocks. In a standard cell design, each distinct cell in a library may have unique geometries of active, gate, and metal levels. Examples of a standard cell or gate array cell include an inverter, a NAND gate, a NOR gate, a flip flop, and other similar logic circuits.

During the process of designing an IC, a designer may select particular cells from a library of cells and use them in a design. The library includes cells that have been designed for a given IC manufacturing process, such as complementary metal oxide semiconductor (CMOS) fabrication. The cells generally have a fixed height but a variable width, which enables the cells to be placed in rows. Cells typically do not change from one design to the next, but the way in which they are interconnected will, to achieve the desired function in a given design. By being able to select the cells from the library for use in the design, the designer can quickly implement a desired functionality without having to custom design the entire integrated circuit from scratch. Thus, the designer will have a certain level of confidence that the integrated circuit will work as intended when manufactured without having to worry about the details of the individual transistors that make up each cell.

Cells are normally designed so that routing connections between cells can be made as efficiently as possible. Routing in an IC design is accomplished through routing elements, such as wires in one or more metal layers. Each metal layer is separated from other metal layers by insulating layers, and vias connect one metal layer to another. These routing elements perform at least two functions: they connect individual transistors that make up a cell, and they connect cells to each other globally (i.e., on a chip-level) to implement the desired functionality of the integrated circuit. For example, clock signals, reset signals, test signals, and supply voltages may be carried through these routing elements. A well-designed cell layout minimizes congestion in routing global interconnections, which reduces the number of metal layers in or overall size of an integrated circuit layout.

Typically, the design layout is checked against a set of design rules in a design rule check (DRC). The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule may be a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a relatively DRC clean (violation free) design.

Most design technologies include via enclosure rules to ensure that both top and bottom metals enclose the via by a certain amount. In other words, such an enclosure rule ensures that each metal layer overlaps a via with a certain amount of extra metal to ensure that the via provides a good connection between the two metal layers once fabricated. The design rule specifying the extra amount of metal around each via may be referred to as a via enclosure rule.

As shown in the prior art standard cell 10 of FIGS. 1A-B, a standard cell architecture will have metal 1 (M1) pins 12A-B that are primarily on a vertical orientation and connected by horizontal metal 2 (M2) wire 14 (FIG. 1B). Standard cell 10 further includes a set of power rails 16A-B and a plurality of routing tracks 18A-D. Standard cell 10 further includes a plurality of pin access points 20A-D distributed between M1 pins 12A-B, as shown. In this case, standard cell 10 is limited to only two access points for each of M1 pins 12A and 12B, which causes a significant impact on routing efficiency and thus chip size.

Furthermore, M1 pins 12A-B have a width 'W', which is approximately the same as the width of via 1 (V1). However, M1 pin 12B extends below V1 and M2 wire 14 a distance 'L' to ensure V1 enclosure rules are satisfied. As a result, there is insufficient via enclosure for M1 pins 12A-B, e.g., in an area 'X' along routing tracks 18A and 18D.

One prior art solution to address this problem is shown by standard cell 30 in FIGS. 2A-B. Standard cell 30 provides an L-shaped pin formed by an M1 patch 32 that extends horizontally along M2 wire 34. As shown, standard cell 30 contains M1 pins 36A-B that are primarily on a vertical orientation and connected by M2 wire 34. Standard cell 30 further includes a plurality of pin access points 38A-D distributed between M1 pins 36A-B, as shown. In this case, V1 is positioned on M1 patch 32 to utilize the bottom pin access point of M1 pin 36B, e.g., along routing track 40D. Sufficient via enclosure is provided on both sides of V1, as represented by distances D1 (FIG. 2B). However, this architecture requires V1 to be positioned outside the boundaries of metal pin 36B, which increases the number of DRC errors, and is difficult to implement in reality. Therefore, what is needed is a solution to at least this deficiency of the prior art.

SUMMARY

In general, embodiments described herein provide approaches for improving circuit routing using a wide-edge pin. Specifically, provided is an integrated circuit (IC) device comprising a standard cell having a first metal layer (M1) pin coupled to a second metal layer (M2) wire at a via. The M1 pin has a width greater than a width of the via sufficient to satisfy an enclosure rule for the via, while the M1 pin extends vertically past the via a distance substantially equal to or greater than zero. This layout increases the number of available pin access points within the standard cell and thus improves routing efficiency and chip size.

One aspect of the present invention includes an integrated circuit (IC) device comprising a standard cell having a first metal layer (M1) pin coupled to a second metal layer (M2) wire at a via, wherein the M1 pin has a width greater than a width of the via sufficient to satisfy an enclosure rule for the via.

Another aspect of the present invention includes a system for generating a layout of an integrated circuit (IC), the system comprising: a processor; and a non-transitory computer readable medium storing instructions, the instructions when executed by the processor causing the system to: generate a layout for the IC, the layout comprising a standard cell having a first metal layer (M1) pin coupled to a second metal layer (M2) wire at a via, wherein the M1 pin has a width greater than a width of the via sufficient to satisfy an enclosure rule for the via.

Another aspect of the present invention provides a method for improving routing efficiency, the method comprising: generating a standard cell having a first metal layer (M1) pin coupled to a second metal layer (M2) wire at a via, wherein the M1 pin has a width greater than a width of the via sufficient to satisfy an enclosure rule for the via.

BRIEF DESCRIPTION OF THE DRAWINGS

These and other features of this invention will be more readily understood from the following detailed description of the various aspects of the invention taken in conjunction with the accompanying drawings in which.

Figure 1A:
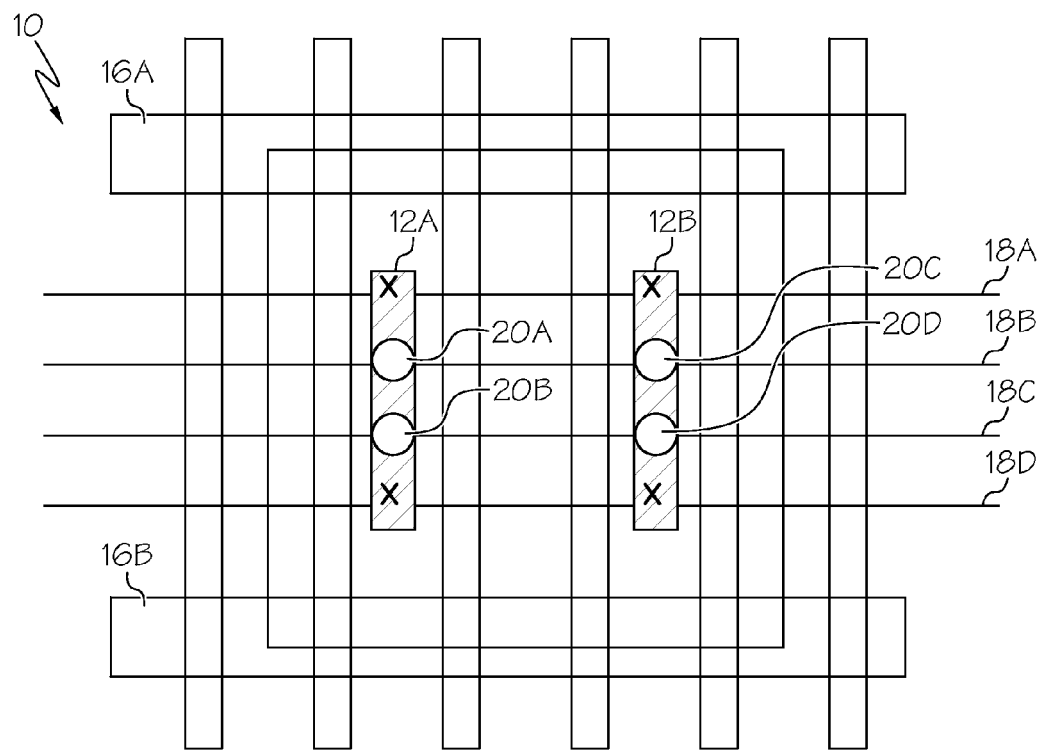
FIG. 1A shows a top view of a prior art standard cell.
Figure 1B:
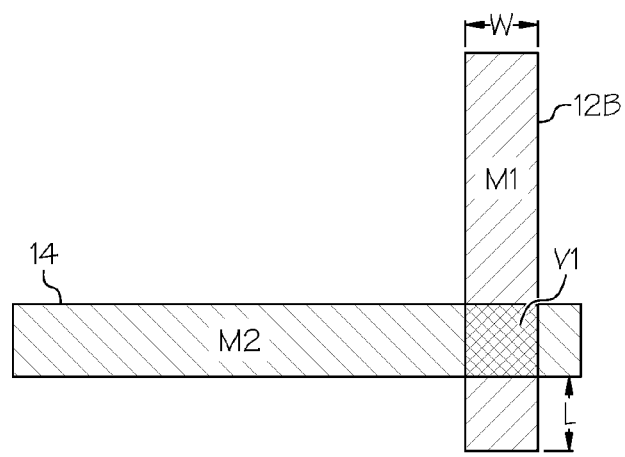
FIG. 1B shows a top view of a via, which is part of the prior art standard cell of FIG. 1A.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are methods and techniques used for improved circuit routing using a wide-edge pin. Specifically, provided is an integrated circuit (IC) device comprising a standard cell having a first metal layer (M1) pin coupled to a second metal layer (M2) wire at a via. The M1 pin has a width greater than a width of the via sufficient to satisfy an enclosure rule for the via, while the M1 pin extends vertically past the via a distance substantially equal to or greater than zero. This layout increases the number of available pin access points within the standard cell and thus improves routing efficiency and chip size.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

A cell described herein refers to predefined circuit unit or circuit element that is provided, as part of a cell library of many different types of circuit units, to an integrated circuit designer. The cell is typically re-used in multiple instances as needed to make up the integrated circuit. For example, a cell may be an inverter, a NAND gate, a NOR gate, a flip flop, and other similar logic circuits. Each cell has a boundary, typically consisting of four edges that form a rectangular shape. A cell pin, (i.e., metal pin, pin, etc.) described herein refers to metal wires within a cell that serve as connection points for external connections to a cell (e.g., connections between one cell and another cell). Cell pins are sometimes referred to as cell ports, although the term cell pin is meant to include both cell pins and cell ports. Cell pins may be input pins, which are the connection points for the input signals of a standard cell. Cell pins may be output pins, which are connection points for the output signals of a standard cell. The locations of the pins are designated by the designer of the cell when creating. As will be described in further detail below, the present invention extends a contact bar across at least one power rail to route and extend the M1 pin.

Figure 3A:
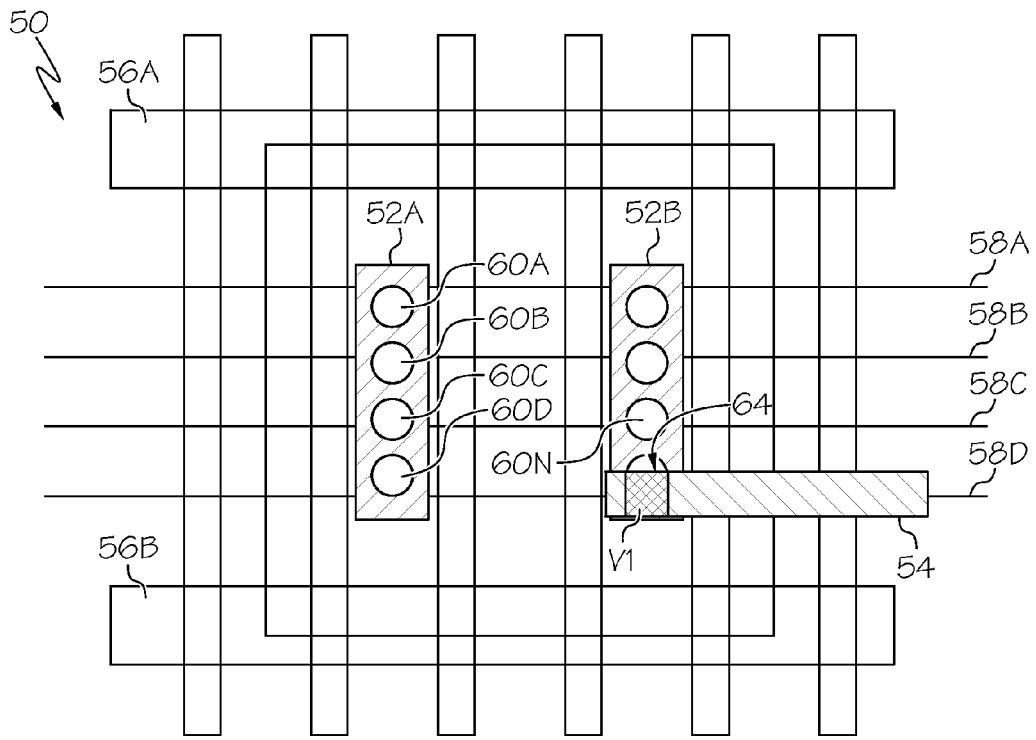
FIG. 3A shows a top view of a standard cell according to illustrative embodiments.
Figure 3B:
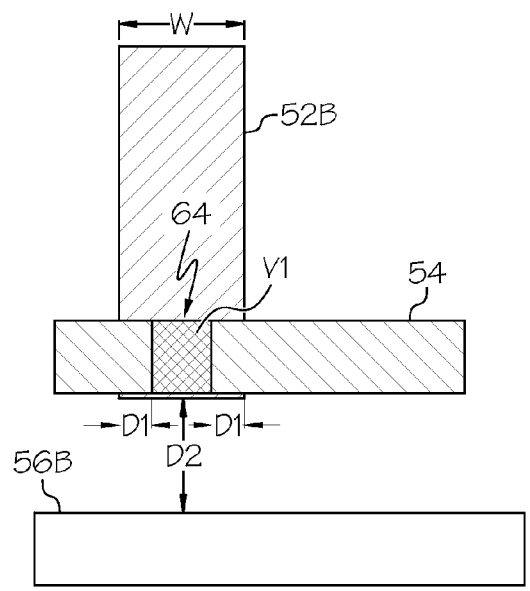
FIG. 3B shows a top view of the standard cell of FIG. 3A having a first metal layer pin coupled to a second metal layer wire at a via according to illustrative embodiments.

With reference again to the figures, FIGS. 3A-B show a top view of an IC standard cell 50 according to exemplary embodiments of the invention. As depicted, standard cell 50 has metal 1 (M1) pins 52A-B that are primarily on a vertical orientation and connected by horizontal metal 2 (M2) wire 54. M1 pin 52B is coupled to M2 wire at a via (V1), wherein M1 pin 52B has a width greater than a width of V1 sufficient to satisfy an enclosure rule for V1, as will be further described below. Standard cell 50 further includes a set of power rails 56A-B and a plurality of routing tracks 58A-D. As shown, standard cell 50 includes a plurality of pin access points 60A-N distributed between M1 pins 52A-B, as shown, including at least one pin access point 64 corresponding to a location of V1 (e.g., along routing track 58D). Unlike the prior art, standard cell 50 is not limited to inner pin access points, e.g., pin access points 60B-C. Instead, standard cell 50 has multiple pin access points located closest to a tip of the M1 pins 52A-B, e.g., pin access points 60A and 60D. The positioning and availability of these access points increases the number of available pin access points within standard cell 50 and thus improves routing efficiency and chip size.

To enable this, M1 pins 52A-B are designed with a width 'W,' as more clearly shown in FIG. 3B. Unlike the prior art solutions in which the M1 pin width is approximately the same as the width of V1, M1 pins 52A-B have a width greater than a width of V1 sufficient to satisfy an enclosure rule for V1. That is, M1 pin 52B extends horizontally (e.g., along M2 wire 54) past each side of V1 a distance D1 to ensure V1 enclosure rules are satisfied. In one non-limiting embodiment, D1 is substantially equal to or greater than 15 nanometers (nm).

Furthermore, as shown in FIG. 3B, M1 pin 52B extends vertically past V1 a distance substantially equal to or greater than zero. Because via enclosure rules for V1 are satisfied by horizontal distances D1, M1 pin 52B is not required to extend past V1. As a result, M1 pin 52B may be positioned a distance D2 (e.g., 50 nm) from power rail 56B to satisfy a side-to-side rule (e.g., while allowing sufficient via enclosure for V1 at pin access point 64, e.g., along routing tracks 58D (FIG. 3A).

Figure 4:
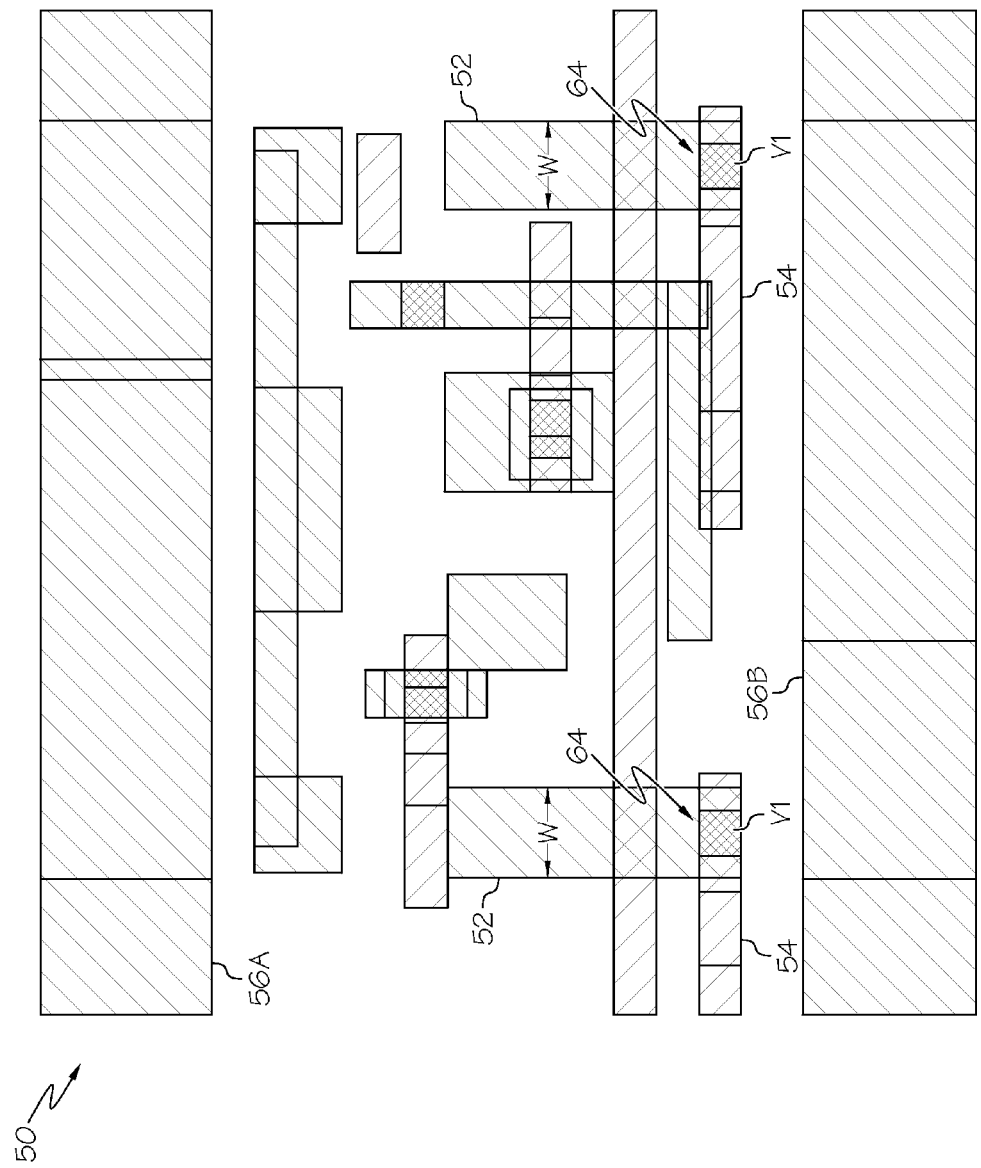
FIG. 4 shows an exemplary layout of a standard cell according to illustrative embodiments.

Turning now to FIG. 4, shown is a non-limiting example of standard cell 50 according to exemplary embodiments. FIG. 4 demonstrates an output of a routed layout generated, e.g., using an integrated circuit compiler (ICC). The ICC delivers a comprehensive design solution, including synthesis, physical implementation, low-power design, and design for manufacturability. ICC is a single, convergent, chip-level physical implementation tool that includes flat and hierarchical design planning, placement and optimization, clock tree synthesis, routing, manufacturability, and low-power capabilities that enable designers to implement a chosen design. As discussed above, M1 pins 52 are designed with a width W greater than a width of V1 sufficient to satisfy an enclosure rule for V1.

As shown, M1 pins 52 are oriented vertically, and connect to M2 wires 54, e.g., at V1. M1 pins 52 extend horizontally (e.g., along M2 wire 54) past each side of V1 a distance sufficient to ensure enclosure rules are satisfied. In one non-limiting embodiment, this distance is substantially equal to or greater than 15 nanometers (nm). M1 pins 52 are further designed to extend vertically past V1 a distance substantially equal to or greater than zero. Because via enclosure rules for V1 are satisfied by the horizontal enclosure distance, M1 pins 52 are not required to extend past V1. As a result, M2 wire 54 can be positioned closer to power rail 56B and the inner M2 wires can be used for other interconnections, thus contributing to decreased chip size.

Figure 2A:
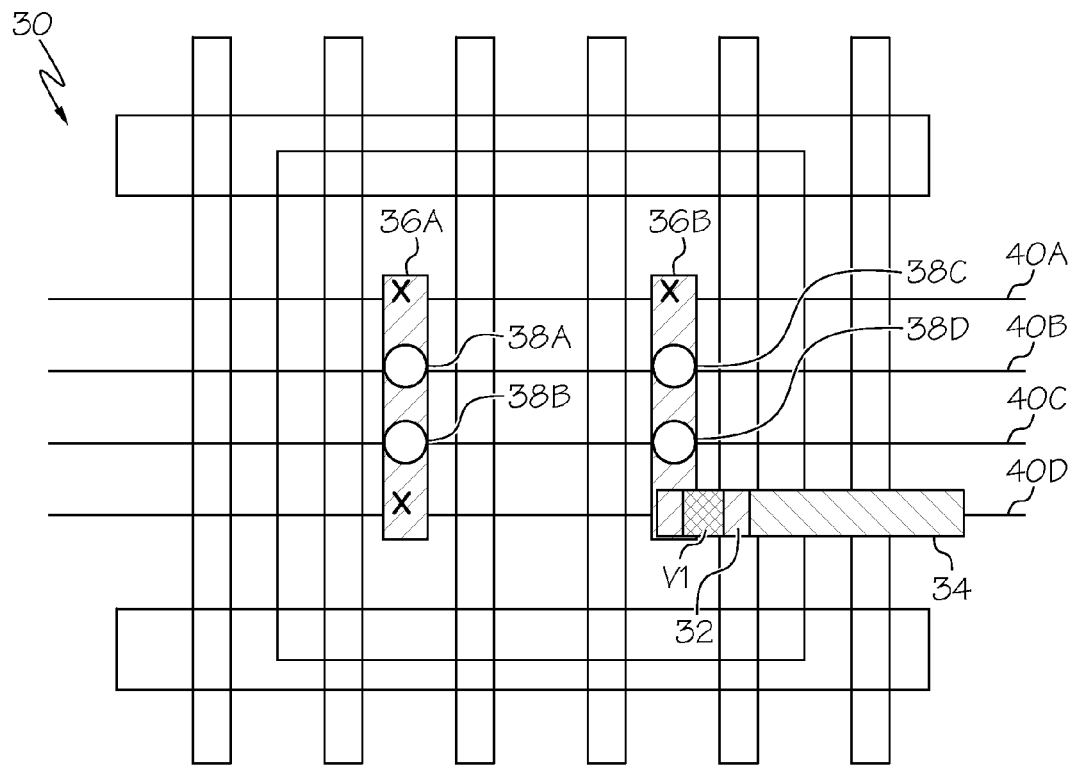
FIG. 2A shows a top view of a prior art standard cell.
Figure 2B:
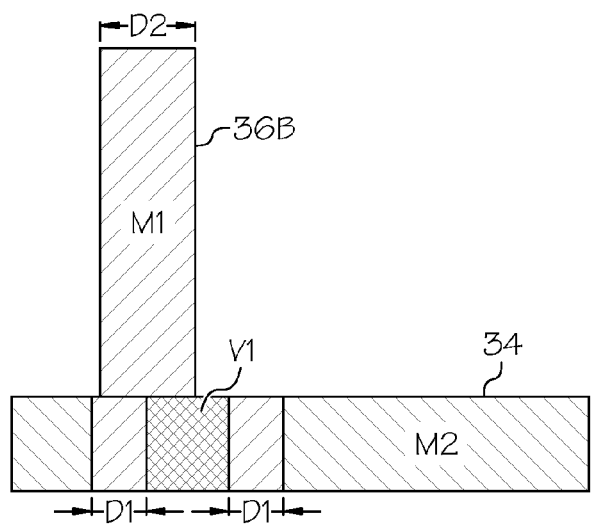
FIG. 2B shows a top view of a via, which is part of the prior art standard cell of FIG. 1A.

Standard cell 50 further includes power rails 56A-B and a plurality of pin access points distributed between M1 pins 52, including at least one pin access point 64 corresponding to a location of V1. Pin access point 64 is an available access point located closest to a tip of the M1 pins 52. The positioning and availability of these access points increases the number of available pin access points within standard cell 50 and thus improves routing efficiency and chip size. Furthermore, with the optimal pin access location shown here, a design rule check will generate significantly less DRC errors than a prior art layout requiring V1 to be positioned outside the boundaries of the metal pins, e.g., as shown in FIGS. 2A-B.

Figure 5:
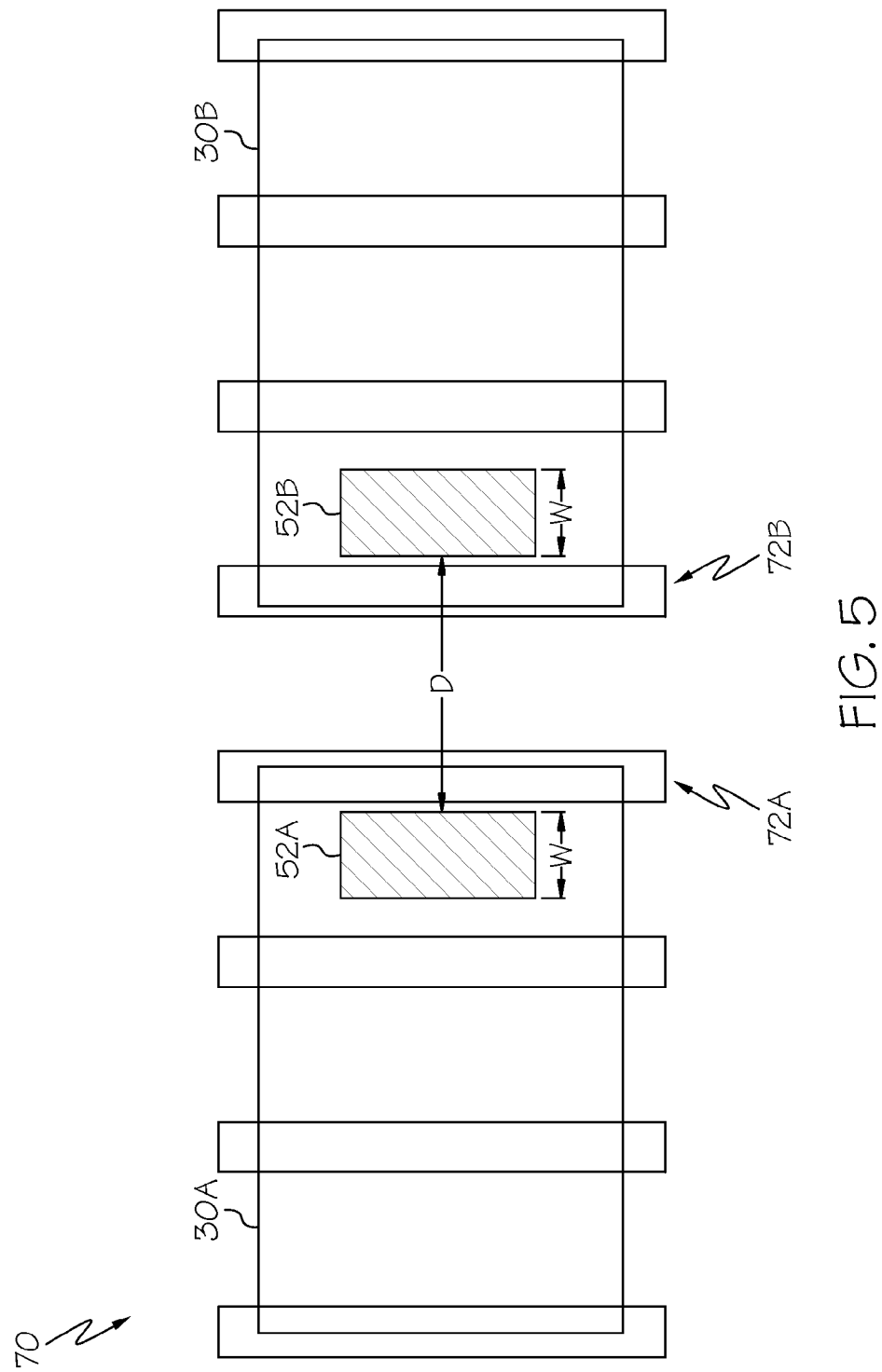
FIG. 5 shows a top view of an exemplary implementation of the standard cell of the invention according to illustrative embodiments.

It will be appreciated that embodiments described herein may be used with IC devices having a double diffusion break that requires two replacement metal gates, which is increasingly being used for 14 nm and 10 nm technologies. For example, an exemplary IC device 70 shown in FIG. 5 includes a pair of replacement metal gates 72A-B (i.e., dummy poly) between two abutted cells 30A-B. M1 pins 52A-B are compatible with IC device 70 because the double diffusion break provides sufficient space to accommodate the width W of M1 pins 52A-B, as well as the relative distance D between pins 52A and 52B.

Figure 6:
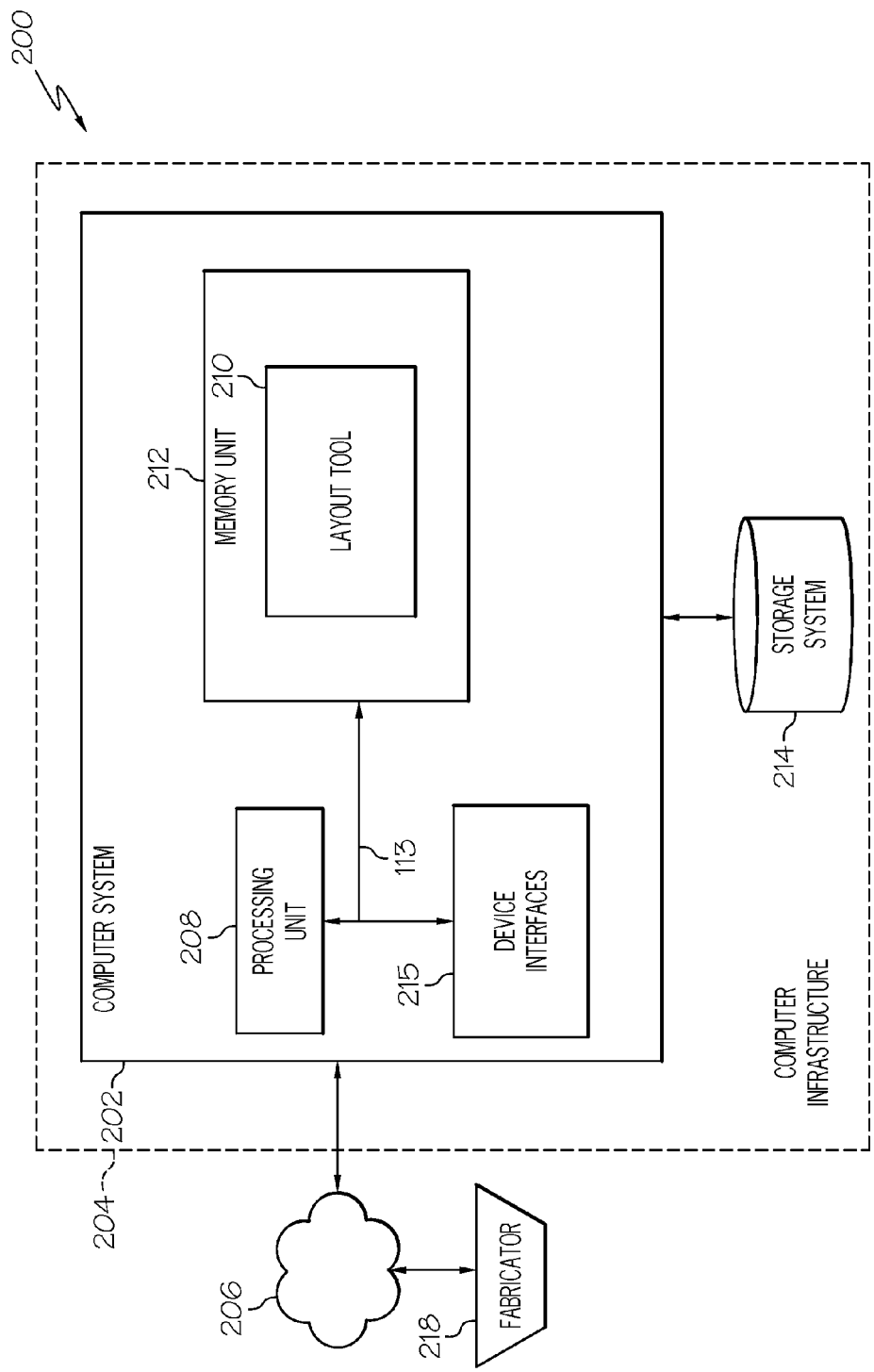
FIG. 6 shows a schematic of an exemplary computing environment according to illustrative embodiments.

Turning now to FIG. 6, depicted is a system 200 that facilitates extending circuit routing in an integrated circuit (IC). As shown, system 200 includes computer system 202 deployed within a computer infrastructure 204. This is intended to demonstrate, among other things, that embodiments can be implemented within a network environment 206 (e.g., the Internet, a wide area network (WAN), a local area network (LAN), a virtual private network (VPN), etc.), a cloud-computing environment, or on a stand-alone computer system. Still yet, computer infrastructure 204 is intended to demonstrate that some or all of the components of system 200 could be deployed, managed, serviced, etc., by a service provider who offers to implement, deploy, and/or perform the functions of the present invention for others.

Computer system 202 is intended to represent any type of computer system that may be implemented in deploying/realizing the teachings recited herein. In this particular example, computer system 202 represents an illustrative system for an improved standard cell connection for circuit routing in an IC. It should be understood that any other computers implemented under various embodiments may have different components/software, but will perform similar functions. As shown, computer system 202 includes a processing unit 208 capable of operating with a layout tool 210 stored in a memory unit 212 to provide pin accessibility for circuit routing. Also shown is a bus 213, and device interfaces 215.

Processing unit 208 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 208 executes computer program code, such as program code for layout tool 210 (e.g., an ICC), which is stored in memory unit 212 and/or storage system 214. While executing computer program code, processing unit 208 can read and/or write data to/from memory unit 212 and storage system 214. Storage system 214 may comprise VCRs, DVRs, RAID arrays, USB hard drives, optical disk recorders, flash storage devices, and/or any other data processing and storage elements for storing and/or processing data. Although not shown, computer system 202 could also include I/O interfaces that communicate with one or more hardware components of computer infrastructure 204 that enable a user to interact with computer system 202 (e.g., a keyboard, a display, camera, etc.). Layout tool 210 of computer infrastructure 204 is configured to operate with a fabricator 218 for designing and patterning features of an IC.

Furthermore, in various embodiments, layout tool 210 can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, layout tool 210 can be a collection of one or more software modules, hardware modules, software/hardware modules or any combination or permutation thereof. As another example, layout tool 210 can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for an improved circuit routing. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. An integrated circuit (IC) device comprising a standard cell having a first metal layer (M1) pin coupled to a second metal layer (M2) wire at a via, wherein the M1 pin has a width at least equal to a width at a first horizontal side of the via and at least equal to a second width at a second horizontal side of the via sufficient to satisfy an enclosure rule for the via, wherein the M1 pin and the M2 pin each entirely enclose the via, and wherein the M1 pin extends vertically past the via towards an adjacent power rail a distance substantially equal to zero.

2. The IC device of claim 1, the M1 pin having a plurality of pin access points including at least one pin access point corresponding to a location of the via.

3. The IC device of claim 2, wherein the at least one pin access point is located closest to a tip of the M1 pin.

4. The IC device of claim 1, wherein the M1 pin extends vertically past the via a distance substantially equal to or greater than zero.

5. The IC device of claim 1, wherein a distance between the power rail and the M1 pin satisfies a side-to-side rule.

6. The IC device of claim 1, wherein the M1 pin extends horizontally on both sides of the via a distance sufficient to satisfy the enclosure rule for the via.

7. The IC device of claim 6, wherein the distance sufficient to satisfy the enclosure rule for the via is substantially equal to or greater than 15 nanometers.

8. A system for generating a layout of an integrated circuit (IC), the system comprising:
    a processor; and
    a non-transitory computer readable medium storing instructions, the instructions when executed by the processor causing the system to:
        generate a layout for the IC, the layout comprising a standard cell having a first metal layer (M1) pin coupled to a second metal layer (M2) wire at a via, wherein the M1 pin has a width at least equal to a first width at a first horizontal side of the via and at least equal to a second width at a second horizontal side of the via sufficient to satisfy an enclosure rule for the via, wherein the M1 pin and the M2 pin each entirely enclose the via, and wherein the M1 pin extends vertically past the via towards an adjacent power rail a distance substantially equal to zero, and wherein the M1 pin comprises at least one pin access point at least partially at the location of the via.

9. The system of claim 8, the M1 pin having a plurality of pin access points including at least one pin access point corresponding to a location of the via.

10. The system of claim 9, wherein the at least one pin access point is located closest to a tip of the M1 pin.

11. The system of claim 8, wherein the M1 pin extends vertically past the via a distance substantially equal to or greater than zero.

12. The system of claim 8, wherein the power rail comprises an M2 power rail, and wherein a distance between the M2 power rail and the M1 pin satisfies a side-to-side rule.

13. The system of claim 8, wherein the M1 pin extends horizontally on both sides of the via a distance sufficient to satisfy the enclosure rule for the via.

14. The system of claim 13, wherein the distance sufficient to satisfy the enclosure rule for the via is substantially equal to or greater than 15 nanometers.

15. A method for improving routing efficiency, the method comprising:
    generating a standard cell having a first metal layer (M1) pin coupled to a second metal layer (M2) wire at a via, wherein the M1 pin has a width at least equal to a width at a first horizontal side of the via and at least equal to a second width at a second horizontal side of the via sufficient to satisfy an enclosure rule for the via, wherein the M1 pin and the M2 pin each entirely enclose the via, and wherein the M1 pin extends vertically past the via towards an adjacent power rail a distance substantially equal to zero.

16. The method of claim 15, further comprising providing a plurality of pin access points for the M1 pin, including at least one pin access point utilized by the via.

17. The method of claim 16, wherein the at least one pin access point utilized by the via is located closest to a tip of the M1 pin.

18. The method of claim 8, wherein the M1 pin extends vertically past the via a distance substantially equal to or greater than zero.

19. The method of claim 15, the power rail comprising an M2 power rail, wherein a distance between the M2 power rail and the M1 pin satisfies a side-to-side rule.

20. The IC method of claim 15, wherein the M1 pin extends horizontally on both sides of the via a distance sufficient to satisfy the enclosure rule for the via, wherein a distance sufficient to satisfy the enclosure rule for the via is substantially equal to or greater than 15 nanometers.

* * * * *